(12) United States Patent
Bailley et al.

(10) Patent No.: US 12,199,004 B2
(45) Date of Patent: Jan. 14, 2025

(54) ELECTRONIC PACKAGES WITH INTEGRAL HEAT SPREADERS

(71) Applicant: Navitas Semiconductor Limited, Dublin (IE)

(72) Inventors: Charles Bailley, San Jose, CA (US); George Chu, Irvine, CA (US); Daniel M. Kinzer, El Segundo, CA (US)

(73) Assignee: Navitas Semiconductor Limited, Dublin (IE)

( * ) Notice: Subject to any disclaimer, the term of this patent is extended or adjusted under 35 U.S.C. 154(b) by 297 days.

(21) Appl. No.: 17/702,694

(22) Filed: Mar. 23, 2022

(65) Prior Publication Data

US 2022/0310475 A1   Sep. 29, 2022

Related U.S. Application Data

(60) Provisional application No. 63/165,529, filed on Mar. 24, 2021.

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4882* (2013.01); *H01L 25/072* (2013.01);
(Continued)

(58) Field of Classification Search
CPC ............ H01L 23/3675; H01L 21/4882; H01L 25/072; H01L 25/50; H01L 23/49562; H01L 23/5383; H01L 23/5384; H01L 24/13; H01L 24/16; H01L 24/29; H01L 24/32; H01L 24/48; H01L 24/73; H01L 25/03; H01L 25/18; H01L 2224/131; H01L 2224/13147; H01L 2224/16227; H01L 2224/16235; H01L 2224/16245; H01L 2224/291; H01L 2224/29139; H01L 2224/2919; H01L 2224/32225;
(Continued)

(56) References Cited

U.S. PATENT DOCUMENTS

2015/0255380 A1   9/2015 Chen
2017/0110978 A1 *   4/2017 Lai .................. H01L 23/49531
(Continued)

OTHER PUBLICATIONS

U.S. Appl. No. 17/738,989, "Non-Final Office Action", Aug. 17, 2022, 6 pages.
(Continued)

*Primary Examiner* — Patricia D Valenzuela
(74) *Attorney, Agent, or Firm* — FisherBroyles, LLP

(57) ABSTRACT

An electronic device includes a substrate and a first gallium nitride (GaN) transistor formed on a first semiconductor die that is electrically coupled to the substrate. A second GaN transistor is formed on a second semiconductor die and is also electrically coupled to the substrate. An integral heat spreader is thermally coupled to the first and the second gallium nitride semiconductor dies and is electrically coupled to the substrate. A first bias voltage is applied to the first GaN transistor via the integral heat spreader and a second bias voltage is applied to the second GaN transistor via the integral heat spreader.

17 Claims, 8 Drawing Sheets

(51) Int. Cl.
  *H01L 25/00* (2006.01)
  *H01L 25/07* (2006.01)
  *H01L 23/498* (2006.01)
  *H01L 23/538* (2006.01)

(52) U.S. Cl.
  CPC ........ *H01L 25/50* (2013.01); *H01L 23/49861* (2013.01); *H01L 23/5389* (2013.01)

(58) Field of Classification Search
  CPC . H01L 2224/32245; H01L 2224/48227; H01L 2224/48247; H01L 2224/73253; H01L 2224/73265; H01L 2224/73267; H01L 2924/10253; H01L 2924/1033; H01L 2924/15192; H01L 2924/15313; H01L 2924/19041; H01L 2924/19042; H01L 2924/19043; H01L 2924/19105; H01L 2924/19107; H01L 2924/30107; H01L 23/4334; H01L 23/3735; H01L 23/5389; H01L 23/49861; H05K 1/0298
  See application file for complete search history.

(56) References Cited

U.S. PATENT DOCUMENTS

| | | | |
|---|---|---|---|
| 2020/0028437 A1* | 1/2020 | Sharma | H02M 3/1588 |
| 2020/0091076 A1* | 3/2020 | Kim | H01L 23/49861 |
| 2020/0357729 A1 | 11/2020 | Kim et al. | |
| 2021/0257272 A1 | 8/2021 | Kothari et al. | |
| 2021/0328551 A1 | 10/2021 | Maalouf et al. | |
| 2022/0122905 A1 | 4/2022 | Schwab et al. | |

OTHER PUBLICATIONS

PCT/US2022/071330, "International Search Report and Written Opinion", Jul. 14, 2022, 11 pages.

\* cited by examiner

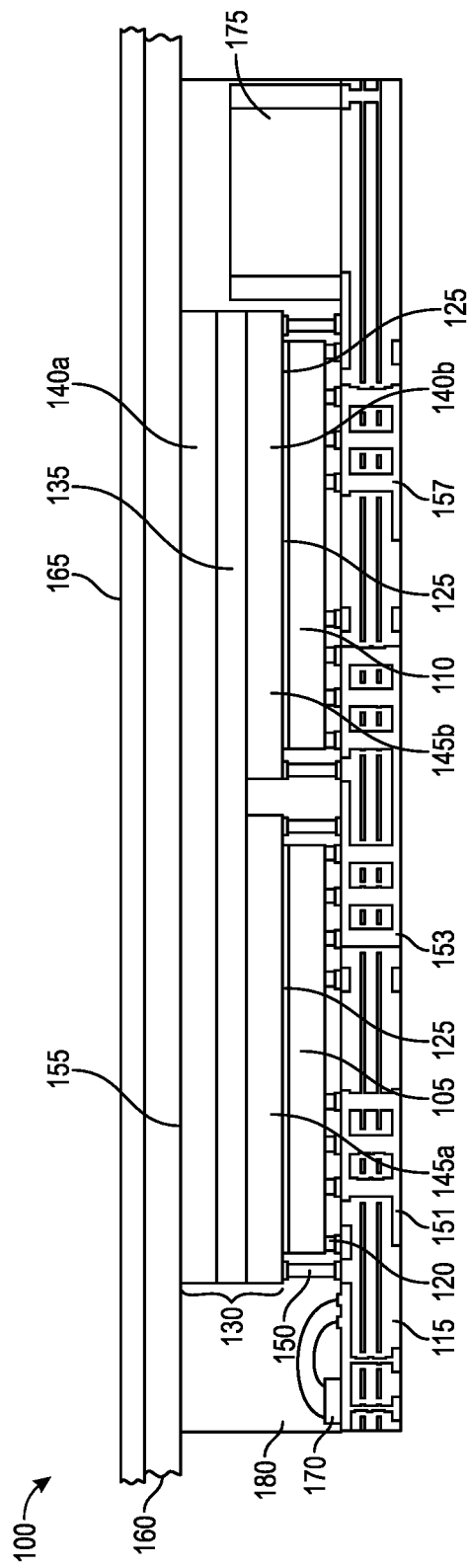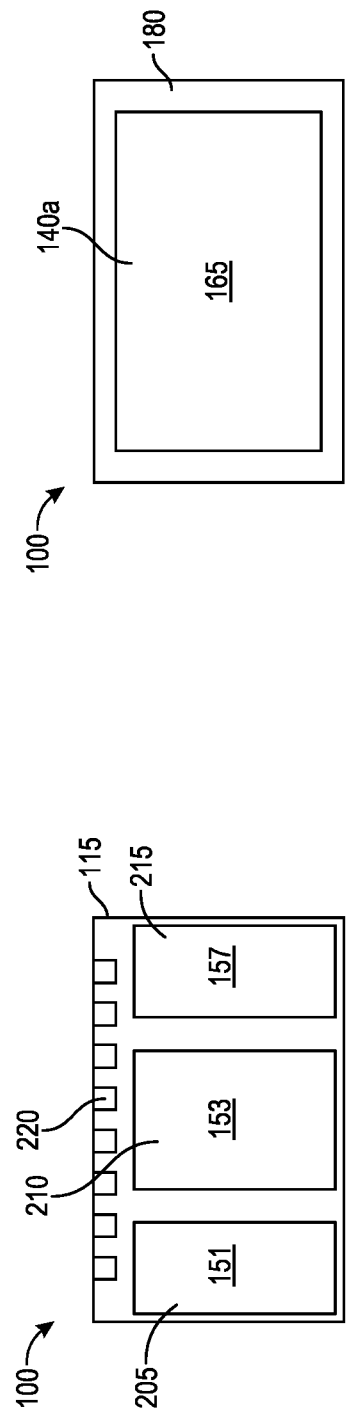

ELECTRONIC PACKAGES WITH INTEGRAL HEAT SPREADERS

CROSS-REFERENCE TO OTHER APPLICATION

This application claims priority to U.S. provisional patent application Ser. No. 63/165,529, for "ELECTRONIC PACKAGES WITH TOP SIDE COOLING" filed on Mar. 24, 2021 which is hereby incorporated by reference in entirety for all purposes.

BACKGROUND

Currently there are a wide variety of electronic devices that can be used in conjunction with each other to form one or more circuits for power management. To improve the performance of such electronic devices often they are attached to one or more heatsinks. However, with electronic devices such as gallium nitride that may employ electrically biased semiconductor substrates, conventional heatsink technologies and electronics packaging architectures cannot both electrically bias the semiconductor substrates while also providing efficient heat removal.

New electronic packaging architectures and integrated heatsinks are required for gallium nitride semiconductor devices.

SUMMARY

Some embodiments of the present disclosure relates to electronic packages for gallium nitride-based semiconductor devices. Some embodiments relate to electronic packages that enable low thermal resistance along with the ability to apply a voltage bias to the semiconductor substrates of the gallium nitride-based semiconductor devices. Further embodiments may enable multiple gallium nitride semiconductor devices to be co-packaged forming one or more phases of a power supply circuit.

In some embodiments an electronic device comprises a substrate and includes a first gallium nitride (GaN) based transistor formed on a first semiconductor die and electrically coupled to the substrate. A second GaN-based transistor is formed on a second semiconductor die and is electrically coupled to the substrate. An integral heat spreader is thermally coupled to the first and the second semiconductor dies. In various embodiments the integral heat spreader includes a ceramic-containing layer sandwiched between a bottom metal layer and a top metal layer. In some embodiments the integral heat spreader includes a ceramic layer sandwiched between a bottom metal layer and a top metal layer, the bottom layer of copper including a first portion electrically coupled to the first semiconductor die and a second portion electrically coupled to the second semiconductor die, and wherein the first portion is electrically isolated from the second portion.

In some embodiments the substrate is electrically coupled to the first portion and supplies a first bias voltage to the first semiconductor die, and wherein the substrate is electrically coupled to the second portion and supplies a second bias voltage to the second semiconductor die. In various embodiments the first semiconductor die is positioned within a first intermediate electronic package that is attached to the substrate and wherein the second semiconductor die is positioned within a second intermediate electronic package that is attached to the substrate. In some embodiments the first semiconductor die includes an active device side opposite a back side and wherein the active device side faces the substrate and the back side faces the integral heat spreader.

In some embodiments the back side is attached to a leadframe paddle positioned at a top surface of the first intermediate electronic package. In some embodiments the first intermediate electronic package includes a control device that includes a gate driver circuit coupled to the first GaN-based transistor. In some embodiments the control device is a circuit formed on a silicon-based semiconductor die. In various embodiments the electronic device further comprises an isolator device coupled to the substrate and arranged to isolate control signals that control operation of the first and the second GaN-based transistors.

In some embodiments the first GaN-based transistor is a high side transistor and the second GaN-based transistor is a low side transistor and wherein the first GaN-based transistor is coupled in series with the second GaN-based transistor to form a single phase half-bridge circuit. In various embodiments the electronic device further comprises a third GaN-based transistor formed on a third semiconductor die and electrically coupled to the substrate, and a fourth GaN-based transistor formed on a fourth semiconductor die and electrically coupled to the substrate. In some embodiments the first GaN-based transistor and the second GaN-based transistor form a first phase of a power supply circuit and wherein the third GaN-based transistor and the fourth GaN-based transistor form a second phase of a power supply circuit.

In some embodiments the substrate, the first semiconductor die, the second semiconductor die and the integral heat spreader are positioned within a cavity formed in an electronic package and sealed within the cavity with a fill material, and wherein the electronic package includes one or more pins arranged to be coupled to a circuit board. In various embodiments the electronic device further comprises a mold compound extending from the substrate and encapsulating the first semiconductor die, the second semiconductor die and at least a portion of the integral heat spreader. In some embodiments a portion of the integral heat spreader forms a portion of a top surface of the electronic device and is arranged to be coupled to a heat sink. In various embodiments the substrate is a multilayer printed circuit board.

In some embodiments a method of forming an electronic package comprises coupling one or more GaN-based semiconductor die to a substrate and attaching an integral heatsink to the one or more GaN-based semiconductor die and electrically coupling the integral heatsink to the substrate. The one or more GaN-based semiconductor die and at least a portion of the integral heatsink are encapsulated. In various embodiments the method further comprises applying an electrical bias to the one or more GaN-based semiconductor die via the integral heatsink. In some embodiments the method further comprises integrating the one or more GaN-based semiconductor die into one or more respective intermediate electronic packages.

Numerous benefits are achieved by way of the present invention over conventional techniques. For example, embodiments of the present invention provide the ability to co-package multiple gallium nitride-based semiconductor devices in a single electronic package that can also apply a separate voltage bias to the substrate of each semiconductor device. The use of an integral heat spreader within the package can enable a reduction in power density so heat can be efficiently transferred through a thermal interface material to a heat sink or cold plate. The close proximity of the semiconductor die within a single electronic package enables improved switching speed and circuit stability while the integral heat spreader mitigates the negative thermal impact of increased power density due to the close proximity of a plurality of gallium nitride devices. Overall, a higher performing circuit can be formed within a reduced amount of space while maintaining the ability to efficiently operate the devices within safe operating temperatures.

These and other embodiments of the invention along with many of its advantages and features are described in more detail in conjunction with the text below and attached figures. To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 1 a simplified partial cross-sectional view of an electronic package that includes a pair of gallium nitride (GaN) semiconductor die and top-sided cooling, according to an embodiment of the disclosure;

FIG. 2 illustrates a simplified bottom plan view of the electronic package illustrated in FIG. 1;

FIG. 3 illustrates a simplified top view of the electronic package illustrated in FIGS. 1 and 2;

DETAILED DESCRIPTION

Figure 4:
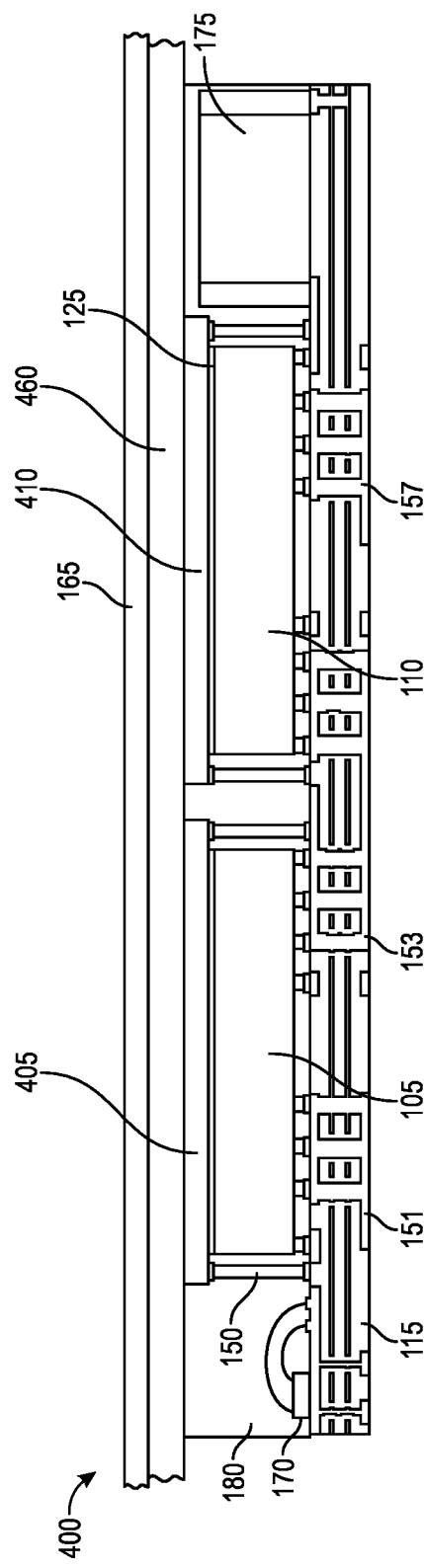
FIG. 4 illustrates a simplified partial cross-sectional view of an electronic package including two integral heat spreaders, according to an embodiment of the disclosure.

Techniques disclosed herein relate generally to electronic packages that include one or more gallium nitride power transistors. More specifically, techniques disclosed herein relate to electronic packages that enable efficient cooling of electronic packages that include gallium nitride power transistors that have electrically biased substrates. Various inventive embodiments are described herein, including methods, processes, systems, devices, and the like.

Several illustrative embodiments will now be described with respect to the accompanying drawings, which form a part hereof. The ensuing description provides embodiment (s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a simplified partial cross-sectional view of an electronic package 100 that includes a pair of gallium nitride (GaN) semiconductor die and top-sided cooling, according to embodiments of the disclosure. As shown in FIG. 1 electronic package 100 includes first and second GaN die 105, 110, respectively, that are arranged to form a portion of a half-bridge power converter, however, in other embodiments a greater number or fewer number of GaN die may be used and may be employed for different circuit functions. In this particular example embodiment, first GaN die 105 is a high side transistor and second GaN die 110 is a low side transistor of a synchronous buck converter circuit. First and second GaN die, 105, 110, respectively, are attached to a substrate 115 in a flip-chip configuration, that is with the active device and interconnect side of each die facing the substrate. Electrical interconnects 120 are formed between first and second GaN die, 105, 110, respectively, and substrate 115 which in one embodiment are copper pillars that are soldered to the substrate, however in other embodiments the interconnects can comprise solder balls, solder pads or can be any other suitable interconnect structure. The flip-chip configuration leaves a back surface 125 of each of first and second GaN die, 105, 110, respectively exposed which will be discussed in more detail below.

An integral heatsink 130 includes a layer of non-electrically conductive ceramic 135 (e.g., $Al_2O_3$, AlN, BeO, etc.) sandwiched between a top and a bottom layer of copper, 140a, 140b, respectively. In some embodiments integral heatsink 130 may be a direct-bonded copper (DBC) substrate or insulated metal substrate (IMS) assembly, however other suitable configurations can be used. Both DBC and IMS substrates typically employ a ceramic-containing layer sandwiched between a top and a bottom metal layer. As defined herein a ceramic containing layer includes a layer formed entirely or partially of ceramic, including a polymer ceramic composite that is commonly used in IMS substrates. In some embodiments the metals are copper, aluminum, a combination thereof or other suitable materials. In some embodiments, bottom layer 140b of copper can be divided into two electrically isolated regions with a first isolated region 145a attached to the exposed back side 125 of first GaN die 105 and a second isolated region 145b attached to the exposed back side 125 of second GaN die 110 using electrically conductive epoxy, solder, silver, fully and/or partially sintered silver or other suitable electrically conductive material. Each of first and second isolated regions 145a, 145b, respectively can be electrically coupled to substrate 115 via one or more extended copper pillars 150 (e.g., 100 micron or other suitable height) that can be attached with solder or other suitable electrically conductive material (e.g., solder or electrically conductive adhesive). In further embodiments other suitable interconnect structures can be used such as, but not limited to leads, wires, clips, wings or components (e.g., resistor, capacitor, etc. that is vertically oriented between bottom layer 145a and substrate 115). First and second isolated regions 145a, 145b can be independently electrically biased via substrate 115 to apply appropriate voltage biases to a bulk substrate of each of first and second GaN die 105, 110, respectively.

In some embodiments top layer of copper 140a is continuous which enables efficient lateral spreading of thermal energy produced by first and second GaN die 105, 110, respectively, and thus enables a reduced thermal power density at a top surface 155 of the electronic package 100. Top layer 140a of copper can be substantially exposed at top surface 155 of electronic package 100 so it can be directly thermally coupled to a cold plate 165, heat sink or other apparatus via a thermal interface material 160 to efficiently transfer thermal energy from each of first and second GaN die, 105, 110, respectively, through bottom layer 140b of copper, through ceramic 135 through thermal interface material 160 and to coldplate 165. Ceramic 135 within integral heatsink 130 provides electrical isolation between top layer of copper 140a and the bulk substrates of first and second GaN die 145a, 145b, respectively, and also provides electrical isolation between each of the bulk substrates of each GaN die. In some embodiments ceramic 135 is approximately 250 microns thick and top layer 140a and bottom layer 140b of copper are each approximately 300 microns thick, however other suitable thicknesses can be used.

In some embodiments one or more control and/or isolation ICs 170 can be attached to substrate 115 and configured to provide control signals and/or drive transistors formed in first and second GaN die 105, 110, respectively. Control and/or isolation ICs 170 can be electrically coupled to substrate 115 using wirebonds, flip-chip technology or other suitable interconnects. Control and/or isolation ICs 170 can provide isolation, short circuit protection, control of switching waveforms, overshoot protection, fault reporting, over temperature protection, ESD protection and/or other features and functions as described in greater detail below.

As described herein, in this particular embodiment first and second GaN die 105, 110 form a portion of a half-bridge buck converter circuit where substrate 115 includes a VIN terminal 151, a switch-node terminal 153 and a ground terminal 157. The close proximity of first GaN die 105 and second GaN die 110 along with the large cross-sectional area of copper forming the switch-node terminal 153 connecting first GaN die 105 and second GaN die 110 (formed within substrate 115 in this embodiment) can enable package 100 to have ultra-low gate loop inductance and ultra-low commutation loop inductance enabling increased switching speeds and improved circuit stability.

One or more integrated passive electronic components 175 (e.g., resistors, capacitors, inductors) can be attached to substrate 115 along with other discrete active components (e.g., diodes, thyristors, etc.). In some embodiments the one or more passives 175 can be combined with a switching function in control and/or isolation ICs 170 to provide a bootstrap circuit. In some embodiments substrate 115 is a multilayer organic-based substrate such as, but not limited to a four layer BT substrate with a plurality of copper layers interconnected by a plurality of vias, however, in further embodiments other suitable materials and numbers of electrical routing layers can be used. Electronic package 100 can be encapsulated with a mold compound 180 or other suitable material that is substantially co-planar with the top layer 140a of copper, or sub-flush, such that the top layer of copper can be in intimate contact with thermal interface material 160 and the cold plate 165.

FIG. 2 illustrates a simplified bottom plan view of package 100 illustrated in FIG. 1. As shown in FIG. 2 substrate 115 includes a land-grid array with three large power connections including a Vin pad 205 (Vin terminal 151) coupled to the first GaN die 105 (e.g., functioning as a high side die in the half-bridge circuit), a SW (switch-node) pad 210 (switch-node terminal 153) coupled to the interconnect formed between the first and second GaN dies, 105, 110, respectively, and a PGND pad 215 (ground terminal 157) coupled to the second GaN die 110 (e.g., functioning as a low side die in the half-bridge circuit). Substrate 115 also includes a plurality of I/O connections 220 that can couple signals into and out of package 100, such as gate control signals, fault signals, logic power signals and the like. FIG. 2 is one example of the electrical connections that can be formed on package 100 and further embodiments can have other suitable arrangements, sizes and configurations of connections.

FIG. 3 illustrates a simplified top view of package 100 illustrated in FIGS. 1 and 2. As shown in FIG. 3 top layer of copper 140a of integral heatsink 130 is exposed and is surrounded by mold compound 180. In some embodiments top layer of copper 140a is coplanar with the mold compound however in other embodiments the mold compound is sub-flush so the copper extends slightly out of the top of the package to facilitate forming a reliable interface with a thermal interface material. In some embodiments top surface 165 can be anodized, plated or coated with a paint, thermal interface material or other suitable material.

FIG. 4 illustrates a simplified partial cross-sectional view of an electronic package 400 that has similar features as electronic package 100 illustrated in FIGS. 1-3 (with similar reference numbers indicating similar features), however electronic package 400 includes two ePads in place of integral heatsink 130 used in electronic package 100. In some embodiments ePads 405, 410 can be made primarily from copper that is plated with one or more metals, however other embodiments may comprise copper tungsten alloys, copper beryllium alloys, silver, gold, aluminum, ceramic, diamond, silicon-carbide or other suitable material. As shown in FIG. 4 package 400 includes high side and low side GaN dies 105, 110, respectively, that are each coupled to a separate copper ePad 405, 410, respectively that are each approximately 200 microns thick. ePads 405, 410 are electrically isolated from each other and are electrically coupled to the respective GaN die bulk substrates, 105, 110 and to substrate 115. Substrate 115 can apply a separate bias voltage to a bulk substrate of each die 105, 110. In some embodiments an electrically insulative thermal interface material 460 is used between ePads 405, 410 and cold plate 165 to insure electrical isolation. In some embodiments package 400 may have a reduced thermal impedance as compared to electronic package 100 illustrated in FIGS. 1-3 because of the removal of the ceramic interlayer which can have a lower thermal conductivity than that of copper.

However, in other embodiments package 100 may have a reduced thermal impedance provided the integral heatsink is large enough to reduce the power density to efficiently traverse the thermal interface material.

Figure 5:
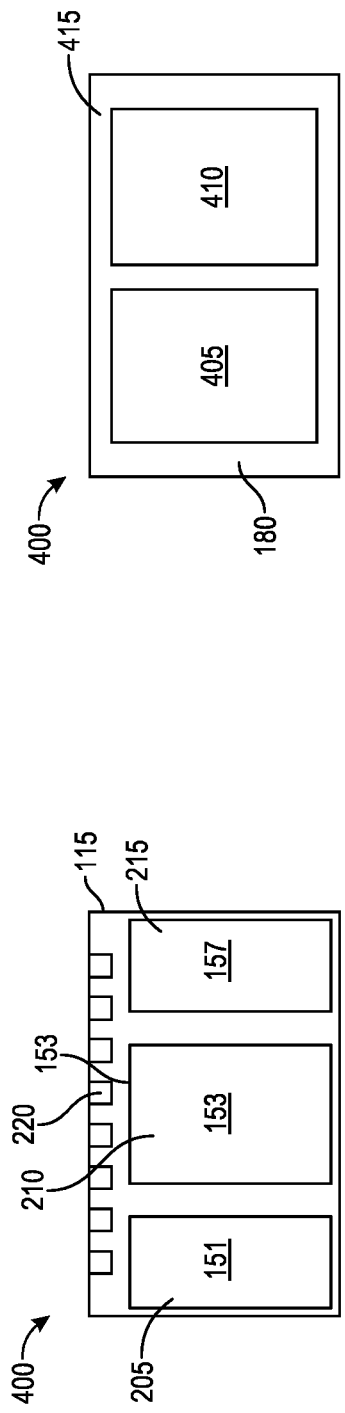
FIG. 5 illustrates a simplified bottom view of the electronic package illustrated in FIG. 4.

FIG. 5 illustrates a simplified bottom view of electronic package 400 illustrated in FIG. 4 and shows a land grid array similar to the interconnect layout of electronic package 100.

Figure 6:
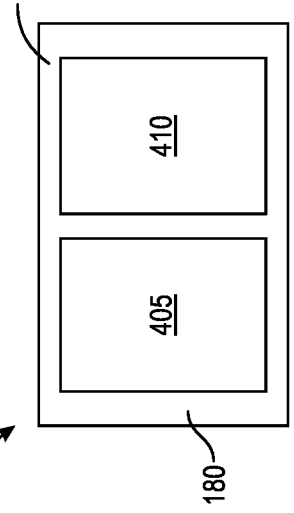
FIG. 6 illustrates a simplified top view of the electronic package illustrated in FIG. 4.

FIG. 6 illustrates a simplified top view of electronic package 400 illustrated in FIGS. 4 and 5. As shown in FIG. 6, there are two separate electrically biased ePads 405, 410 exposed at a top surface 415 of electronic package 400.

Figure 7:
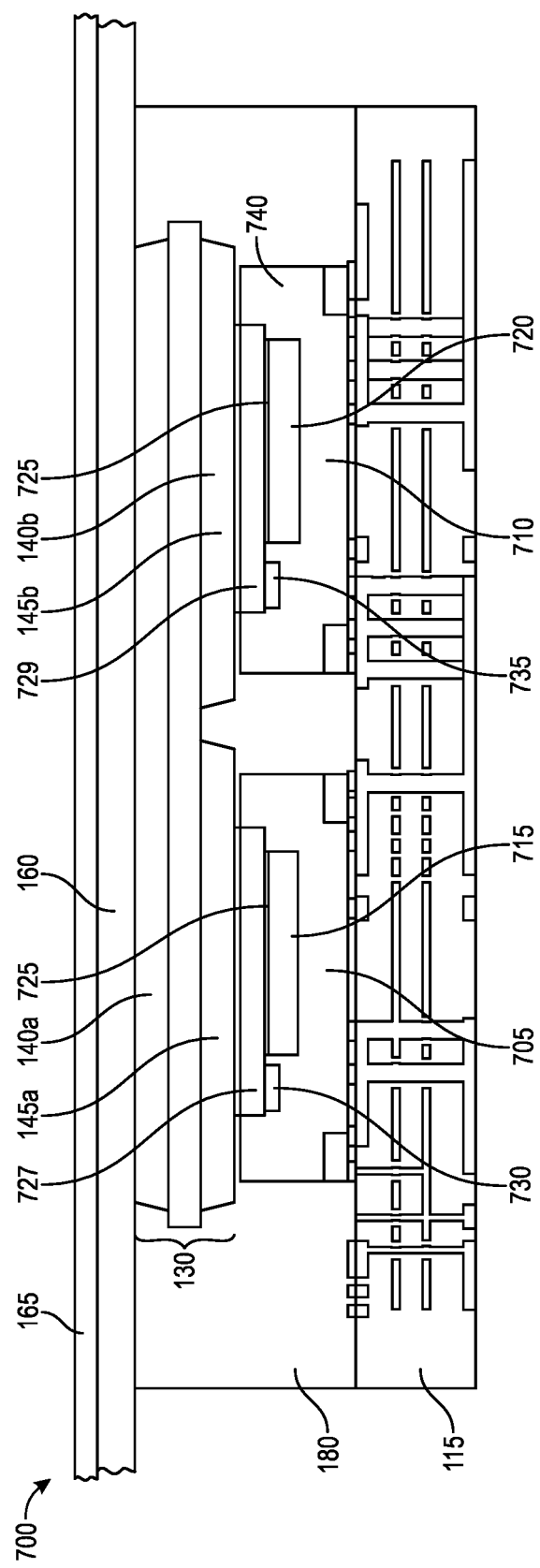
FIG. 7 illustrates a simplified partial cross-sectional view of an electronic package including GaN die in intermediate electronic packages, according to an embodiment of the disclosure.

FIG. 7 illustrates a simplified partial cross-sectional view of an electronic package 700 that has similar features as electronic package 100 illustrated in FIGS. 1-3 (with similar reference numbers indicating similar features), however electronic package 700 includes GaN and silicon die in intermediate packages 705, 710. As shown in FIG. 7, electronic package 700 includes high side and low side GaN die 715, 720 that are each in separate intermediate electronic packages, 705, 710, respectively. In this particular embodiment, GaN die 715, 720 have back surfaces 725 that are each attached to leadframe portions 727, 729 (also called paddles) using electrically conductive epoxy, solder, silver, fully and/or partially sintered silver or other suitable electrically conductive material. Leadframe portions 727, 729 are attached to isolated regions 145a, 145b of integral heat sink 130 using electrically conductive epoxy, solder, silver, fully and/or partially sintered silver or other suitable electrically conductive material.

As further shown in FIG. 7, in this embodiment, intermediate electronic packages 705, 710 each include a separate control die 730, 735, respectively, that can be silicon, GaN or other semiconductor device that is coupled to GaN die 715, 720, respectively. GaN die 715, 720 and control die 730, 735 can be electrically connected to intermediate electronic packages 705, 710 via wirebonds, flip-chip or other suitable interconnect method and overmolded with molding material 740. In some embodiments bulk substrates of GaN die 715, 720 can be electrically biased via intermediate package connections and/or via external connections similar to extended copper pillars 150 (see FIG. 1). In this embodiment intermediate electronic packages 705, 710 are dual-flat no-lead (DFN) packages, however, the intermediate packages can be any suitable wirebond, flip-chip, chip-scale or other package and can include a metallic pad to which one or more GaN and/or silicon die are attached.

In some embodiments the use of intermediate electronic packages 705, 710 can enable improved yield of electronic package 700 because of the ability to test the intermediate electronic packages 705, 710 before integration. Further, the use of intermediate electronic packages 705, 710 may enable simplified assembly of electronic package 700 due to the increased feature size of the intermediate electronic packages and the reduced cleanliness and handling procedures as compared to those required when processing bare die.

In some embodiments mold compound 180 can be selected to act as an underfill material that fills in gaps between intermediate electronic packages 705, 710 and electronic package 700. In various embodiments the coefficient of thermal expansion (CTE) of the mold compounds 180, 740 and the integral heatsink 130 can be selected to be approximately the same to minimize internal stresses.

Figure 8:
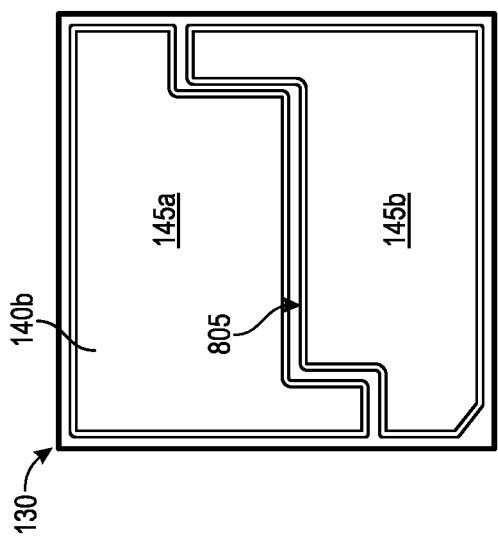
FIG. 8 illustrates a plan view of bottom layer of copper of the integral heatsink illustrated in FIG. 7.

FIG. 8 illustrates a plan view of bottom layer of copper 140b of integral heatsink 130. As shown in FIG. 8, in some embodiments interface region 805 between first isolated region 145a and second isolated region 145b can be arranged in an irregular, stair-step, saw-tooth or other suitable geometry to increase adhesion of the copper to the ceramic.

Figure 9:
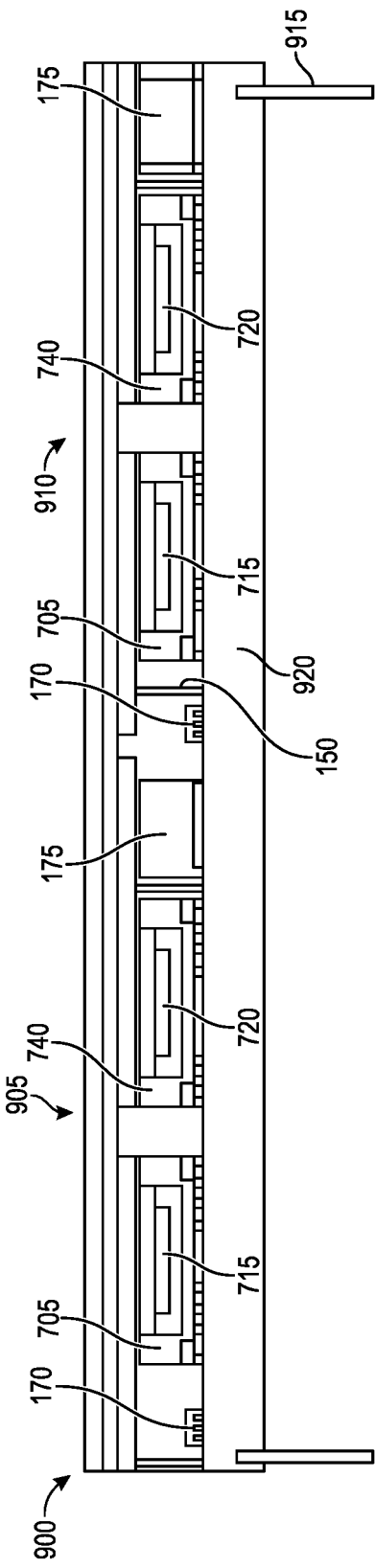
FIG. 9 illustrates a simplified partial cross-sectional view of an electronic package including two phases of a power supply circuit, according to an embodiment of the disclosure.

FIG. 9 illustrates a simplified partial cross-sectional view of an electronic package 900 that has similar features as electronic package 700 illustrated in FIG. 7 (with similar reference numbers indicating similar features), however electronic package 900 includes a two-phase architecture as compared to electronic package 700 that has a single-phase architecture. As shown in FIG. 9, electronic package 900 includes a first phase half-bridge circuit 905 and a second phase half-bridge circuit 910. Each phase can include separate high-side and low-side GaN-based transistors as explained in more detail herein. Other embodiments can include three-phase, four-phase or a greater number of phases within a single electronic package.

As further shown in FIG. 9, electronic package 900 includes through-hole pins 915 positioned within substrate 920. Through-hole pins 915 can be configured to be soldered into vias of a receiving board, connected to a socket or press-fit into vias of a receiving board. Any of the electronic packages disclosed herein can use the thru-hole configuration and similarly, electronic package 900 can also be configured as a land-grid array as shown in FIGS. 1-2.

Figure 10:
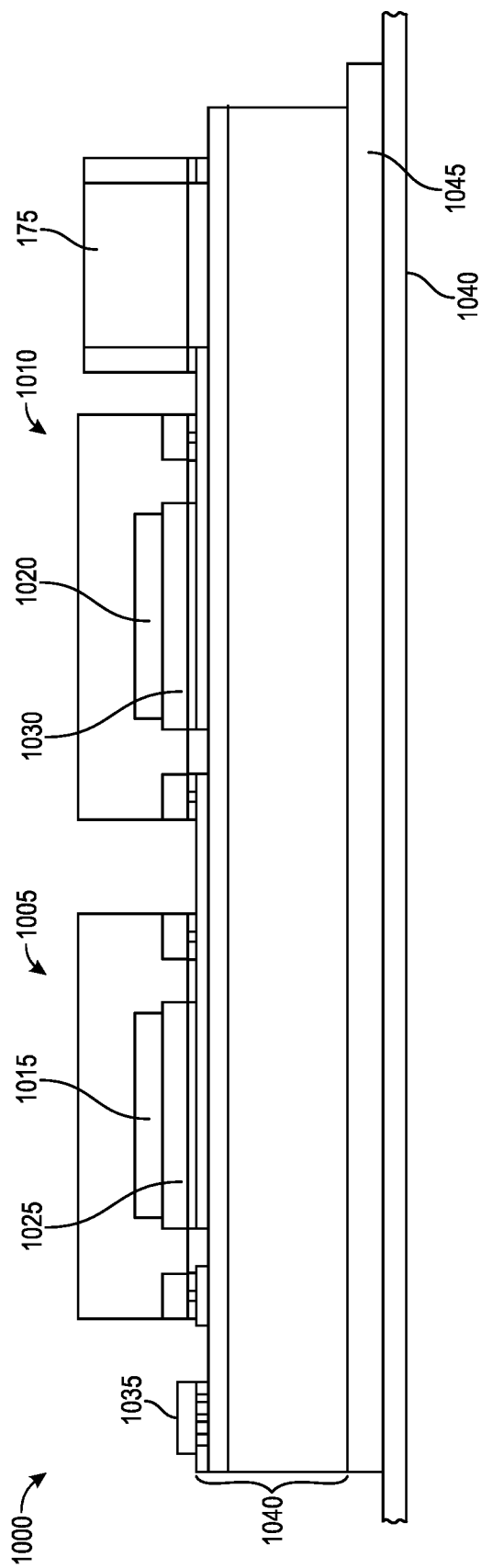
FIG. 10 illustrates a simplified partial cross-sectional view of an electronic package that can be used with bottom-side cooling, according to an embodiment of the disclosure.

FIG. 10 illustrates a simplified partial cross-sectional view of an electronic package 1000 that has similar features as electronic package 700 illustrated in FIG. 7 (with similar reference numbers indicating similar features), however electronic package 1000 is a bottom-cooled architecture with inverted intermediate electronic packages. As shown in FIG. 10, electronic package 1000 includes two intermediate electronic packages 1005, 1010 that each include a GaN transistor 1015, 1020, respectively attached to a leadframe portion 1025, 1030 of each respective intermediate electronic package. In some embodiments each intermediate electronic package 1005, 1010 can include one or more control devices, as described herein. However, in this embodiment, control device 1035 is shown outside of intermediate electronic packages and attached to substrate 1040. In some embodiments substrate 1040 can be what is commonly referred to as an insulated metal substrate (IMS) that has a relatively high thermal conductivity enabling thermal energy to be coupled from GaN transistors 1015, 1020 to a cold plate 1040 via a thermal interface material 1045.

Figure 11:
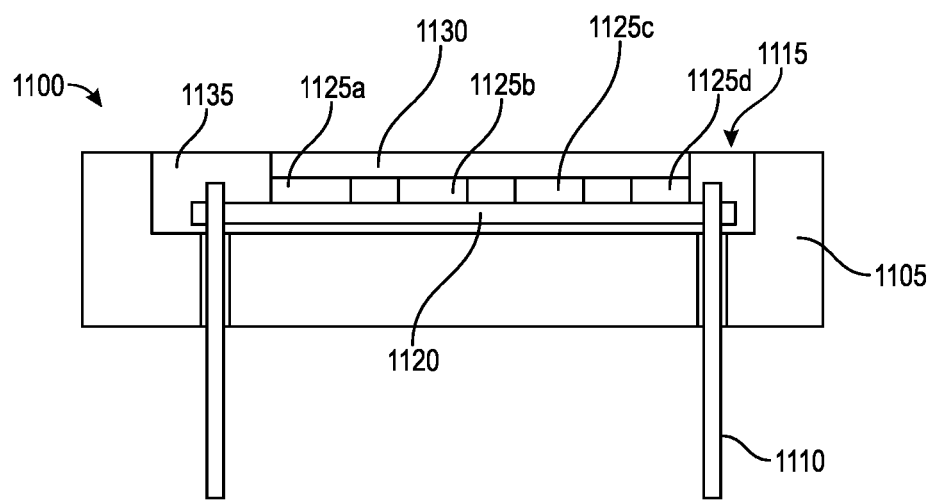
FIG. 11 illustrates a simplified partial cross-sectional view of a through-hole electronic package, according to an embodiment of the disclosure.

FIG. 11 illustrates a simplified partial cross-sectional view of an electronic package 1100 that has similar features as electronic package 900 illustrated in FIG. 9 (with similar reference numbers indicating similar features), however electronic package 1100 includes a two-phase architecture within a through-hole module 1100. As shown in FIG. 11, module 1100 includes a plastic body 1105 including a plurality of through-hole pins 1110 that can either be a solder-in configuration or a press-fit configuration. Plastic body 1105 can include a cavity 1115 that receives substrate 1120 coupled to pins 1110. Substrate 1120 can includes four GaN based transistors 1125a-1125d that are all coupled to a unitary integral heatsink 1130. GaN-based transistors 1125a-1125d can be placed within intermediate packages as shown, for example in FIG. 7 or can be bare die as shown, for example in FIGS. 1 and 4. Integral heatsink 1130 can have any of the configurations shown herein or any other suitable configuration. Cavity 1115 can be filled in with a fill material 1135 that can be any type of gel, filler, mold-compound, underfill or any other suitable material. One or more control die can be attached to substrate 1120 or positioned within intermediate electronic packages as disclosed herein. A greater number or a lesser number of phases can be formed within module 1100 as appreciate by one of ordinary skill in the art having the benefit of this disclosure.

Figure 12:
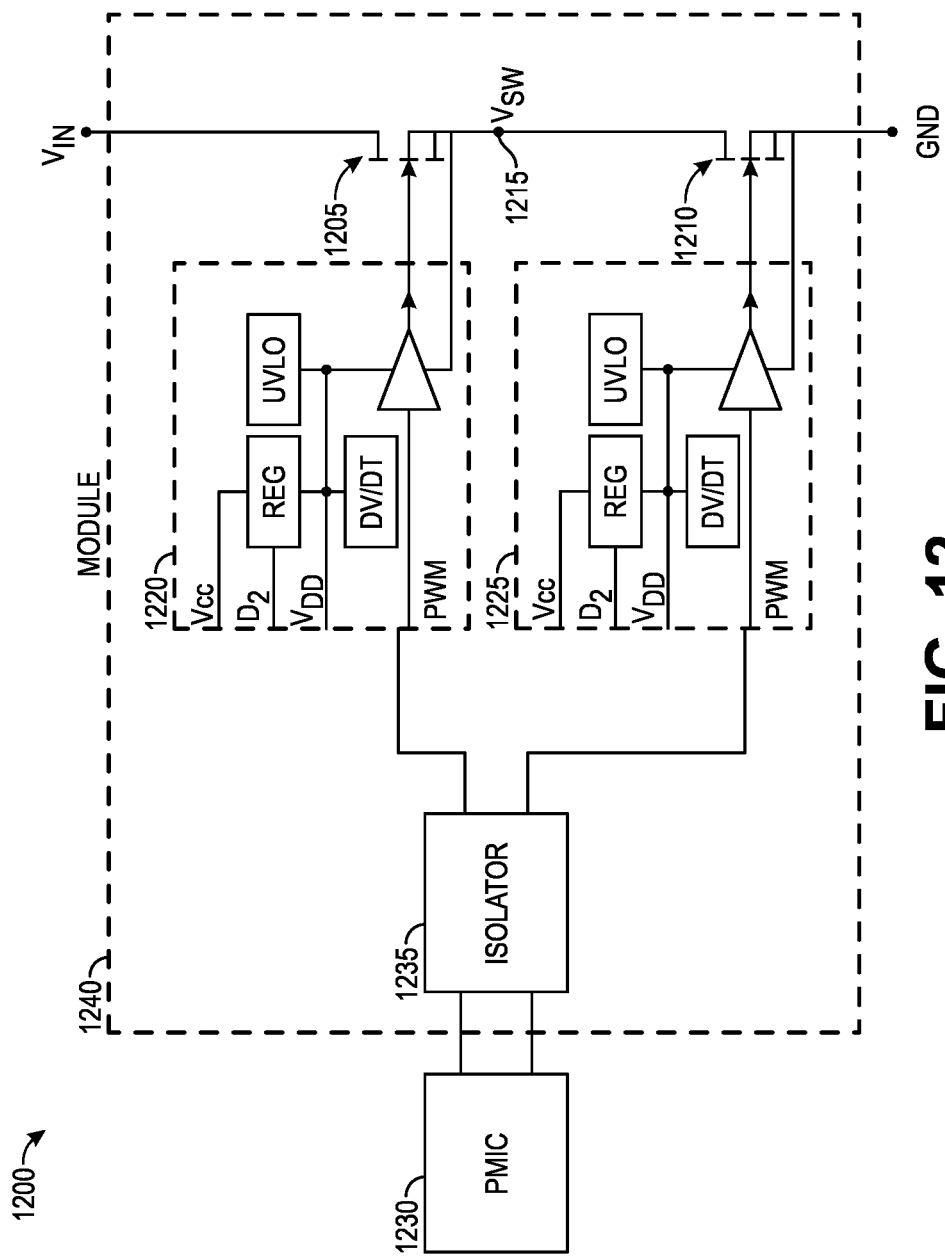
FIG. 12 illustrates a simplified electrical schematic of a single-phase half-bridge circuit, according to embodiments of the disclosure.

FIG. 12 illustrates a simplified electrical schematic of a single-phase half-bridge circuit 1200 that can be employed in any of the electronic packages shown herein. A first GaN die 1205 is a high side GaN transistor and second GaN die 1210 is a low side GaN transistor that are coupled together in a half-bridge configuration forming a switch node (Vsw) 1215 between the two die. First GaN die 1205 can be coupled to a first control die 1220 and second GaN die 1210 can be coupled to a second control die 1225. Control die 1220, 1225 can each include one or more of the following circuits: gate driver, under voltage lock out, dV/dt detection and protection, power regulation, over temperature protection, level-shifting, boot strap power supply, isolation, over current protection, trim functions and/or protection circuitry. Each control die 1220, 1225 can be arranged to receive a control signal from a controller 1230 via an optional isolator device 1235 that can be, for example an optically coupled, digitally coupled, magnetically coupled or other suitable type of isolation device. In other embodiments isolator device 1235 may not be used. In some embodiments isolator 1235, control die 1220, 1225 and first and second GaN die, 1205, 1210, respectively, can be integrated within a single electronic package 1240, however, other embodiments may have one or more of these devices integrated within the electronic package.

Figure 13:
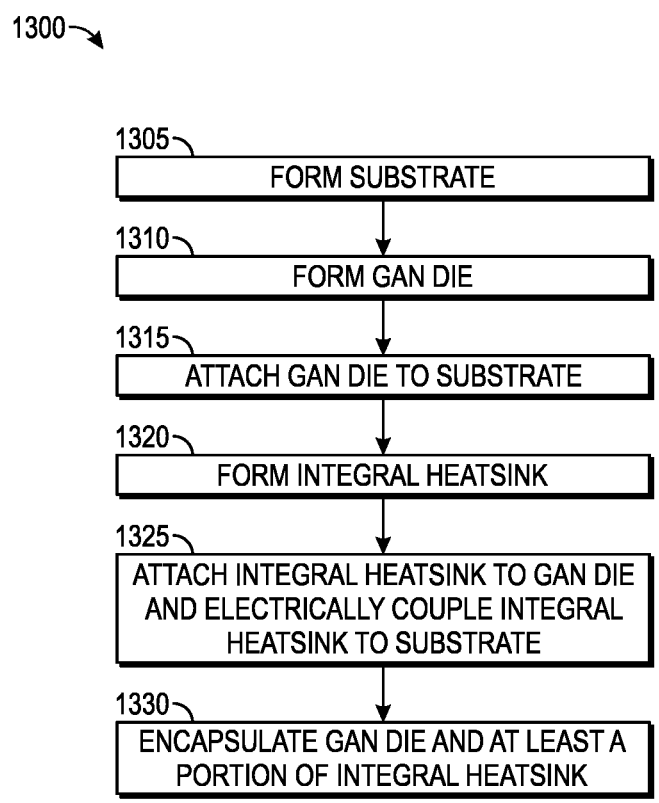
FIG. 13 illustrates steps associated with a method 1300 of forming an electronic package, according to embodiments of the disclosure.

FIG. 13 illustrates steps associated with a method 1300 of forming an electronic package, according to embodiments of the disclosure. Step 1305 includes the formation of a substrate. In some embodiments the substrate may be a multi-layer printed circuit board however in other embodiments it may only have one layer and/or may be made from other materials such as, for example ceramics, metals, dielectrics and the like.

Step 1310 includes the formation of one or more GaN die. In some embodiments each GaN die can include one or more transistors, however, in other embodiments each GaN die can include one or more logic, driver and/or control circuits. In some embodiments each GaN die can have an active surface that includes the one or more transistors, positioned opposite of a back surface which is a portion of the bulk semiconductor substrate.

Step 1315 includes the attachment of the one or more GaN die to the substrate. In some embodiments the one or more GaN die are attached to the substrate in a flip-chip configuration wherein the active surface of the die faces the substrate, however in other embodiments the die can be attached where the back side attaches to the substrate and the active surface is electrically coupled to the substrate via wirebonds.

Step 1320 includes the formation of an integral heatsink. In some embodiments the integral heatsink includes a layer of ceramic sandwiched between two layers of copper an may be known as a direct-bonded copper (DBC) or insulated metal substrate (IMS). In other embodiments the integral heatsink may include one or more layers of relatively high thermal conductivity materials such as copper, aluminum, ceramic, diamond and the like.

Step 1325 includes the attachment of the integral heatsink to the one or more GaN die and electrically coupling the integral heatsink to the substrate. In some embodiments the integral heatsink can be electrically and thermally coupled to the one or more GaN die with solder, electrically conductive adhesive, sintered silver, diffusion bonding or other suitable technique. In various embodiments the integral heatsink can be electrically coupled to the substrate such that the substrate can apply an electrical bias via the integral heatsink to the bulk semiconductor substrate. In some embodiments a column, lead or other interconnect can be used to apply an electrical bias voltage from the substrate to each GaN die.

Step 1330 includes the encapsulation of the one or more GaN die and at least a portion of the integral heatsink. In some embodiments a mold compound is used however in other embodiments any type of gel, underfill or other suitable material can be used.

It will be appreciated that process 1300 is illustrative and that variations and modifications are possible. Steps described as sequential may be executed in parallel, order of steps may be varied, and steps may be modified, combined, added or omitted.

Although the GaN die discussed in the preceding embodiments are described as forming half-bridge circuits one of ordinary skill in the art having the benefit of this disclosure will appreciate that single GaN devices as well as any number of GaN devices can be used for different electrical purposes and can be employed according to one or more of the disclosed embodiments. For example, in one embodiment a series of GaN devices can be employed in a multi-phase motor driver circuit while in another embodiment a plurality of GaN devices can be used for a high speed, high power multiplexing switch matrix. Any of these embodiments can be integrated in one or more of the packaging configurations disclosed herein.

For simplicity, various peripheral components, such as capacitors, resistors, diodes and the like are not shown in the figures and the electrical schematics.

In some embodiments the GaN-based die can include one or more gallium nitride and/or other layers formed on a silicon-based substrate, where the active device(s) are formed in the one or more gallium nitride layers and the silicon acts as a bulk substrate for the die. The GaN transistors can include a two-degree electron gas region in which a conductive channel may be formed.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. An electronic device comprising:
   a substrate;
   a first gallium nitride (GaN) based transistor formed on a first semiconductor die and electrically coupled to the substrate;
   a second GaN-based transistor formed on a second semiconductor die and electrically coupled to the substrate; and
   an integral heat spreader thermally coupled to the first and the second semiconductor dies, the integral heat spreader comprising a bottom metal layer electrically coupled to the first semiconductor die and to the second semiconductor die, wherein the bottom metal layer is configured to be electrically biased by the substrate to apply a voltage bias to at least one of the first semiconductor die or the second semiconductor die.

2. The electronic device of claim 1 wherein the integral heat spreader includes a ceramic-containing layer sandwiched between the bottom metal layer and a top metal layer.

3. The electronic device of claim 1 wherein the integral heat spreader includes a ceramic layer sandwiched between the bottom metal layer and a top metal layer, the bottom metal layer of copper including a first portion electrically coupled to the first semiconductor die and a second portion electrically coupled to the second semiconductor die, and wherein the first portion is electrically isolated from the second portion.

4. The electronic device of claim 3 wherein the substrate is electrically coupled to the first portion and wherein the first portion is configured to be electrically biased by the substrate to apply a first bias voltage to the first semiconductor die, and wherein the substrate is electrically coupled to the second portion and wherein the second portion is configured to be electrically biased by the substrate to apply a second bias voltage to the second semiconductor die.

5. The electronic device of claim 1 wherein the first semiconductor die is positioned within a first intermediate electronic package that is attached to the substrate and wherein the second semiconductor die is positioned within a second intermediate electronic package that is attached to the substrate.

6. The electronic device of claim 5 wherein the first semiconductor die includes an active device side opposite a back side and wherein the active device side faces the substrate and the back side faces the integral heat spreader.

7. The electronic device of claim 6 wherein the back side is attached to a leadframe paddle positioned at a top surface of the first intermediate electronic package.

8. The electronic device of claim 5 wherein the first intermediate electronic package includes a control device that includes a gate driver circuit coupled to the first GaN-based transistor.

9. The electronic device of claim 8 wherein the control device is a circuit formed on a silicon-based semiconductor die.

10. The electronic device of claim 1 further comprising an isolator device coupled to the substrate and arranged to isolate control signals that control operation of the first and the second GaN-based transistors.

11. The electronic device of claim 1 wherein the first GaN-based transistor is a high side transistor and the second GaN-based transistor is a low side transistor and wherein the first GaN-based transistor is coupled in series with the second GaN-based transistor to form a single phase half-bridge circuit.

12. The electronic device of claim 1 further comprising a third GaN-based transistor formed on a third semiconductor die and electrically coupled to the substrate; and a fourth GaN-based transistor formed on a fourth semiconductor die and electrically coupled to the substrate.

13. The electronic device of claim 12 wherein the first GaN-based transistor and the second GaN-based transistor form a first phase of a power supply circuit and wherein the third GaN-based transistor and the fourth GaN-based transistor form a second phase of a power supply circuit.

14. The electronic device of claim 1 wherein the substrate, the first semiconductor die, the second semiconductor die and the integral heat spreader are positioned within a cavity formed in an electronic package and sealed within the cavity with a fill material, and wherein the electronic package includes one or more pins arranged to be coupled to a circuit board.

15. The electronic device of claim 1 further comprising a mold compound extending from the substrate and encapsulating the first semiconductor die, the second semiconductor die and at least a portion of the integral heat spreader.

16. The electronic device of claim 15 wherein a portion of the integral heat spreader forms a portion of a top surface of the electronic device and is arranged to be coupled to a heat sink.

17. The electronic device of claim 1 wherein the substrate is a multilayer printed circuit board.

* * * * *